United States Patent [19]

Jacobsen

[11] Patent Number: 5,270,485
[45] Date of Patent: Dec. 14, 1993

[54] HIGH DENSITY, THREE-DIMENSIONAL, INTERCOUPLED CIRCUIT STRUCTURE

[75] Inventor: Stephen C. Jacobsen, Salt Lake City, Utah

[73] Assignee: Sarcos Group, Salt Lake City, Utah

[21] Appl. No.: 871,336

[22] Filed: Apr. 21, 1992

Related U.S. Application Data

[63] Continuation-in-part of Ser. No. 816,628, Dec. 12, 1991, which is a continuation-in-part of Ser. No. 647,659, Jan. 28, 1991, Pat. No. 5,106,455.

[51] Int. Cl.$^5$ ............................................... H05K 7/20
[52] U.S. Cl. ................................. 174/15.1; 174/252; 174/260; 361/689
[58] Field of Search ....................... 174/15.1, 252, 250, 174/260; 361/381, 382, 383

[56] References Cited

U.S. PATENT DOCUMENTS

| | | | |
|---|---|---|---|
| 3,401,448 | 9/1968 | Iles et al. | 437/249 X |
| 3,534,467 | 10/1970 | Sachs et al. | 437/249 |
| 3,875,479 | 4/1975 | Jaggar | 361/414 |
| 3,976,508 | 8/1976 | Mlavsky | 136/246 |
| 4,020,830 | 5/1977 | Johnson et al. | 128/2 E |
| 4,884,167 | 11/1989 | Mine | 361/382 |
| 5,016,138 | 5/1991 | Woodman | 361/381 |
| 5,053,856 | 10/1991 | Davidson | 357/82 |
| 5,106,455 | 4/1992 | Jacobsen et al. | 156/659.1 |
| 5,124,508 | 6/1992 | DuBrucy | 174/260 |

FOREIGN PATENT DOCUMENTS 185900 8/1991 Japan ................................ 174/15.1

*Primary Examiner*—Morris H. Nimmo
*Attorney, Agent, or Firm*—Thorpe, North & Western

[57] ABSTRACT

A three-dimensional circuit structure includes a plurality of elongate cylindrical substrates positioned in parallel and in contact with one another. Electrical components are formed on the surfaces of the substrates, along with electrical conductors coupled to those components. The conductors are selectively positioned on each substrate so as to contact conductors on adjacent substrates to allow for the transfer of electrical signals between substrates. The conductor patterns on the substrates may be helical, circumferential, or longitudinal, in such a fashion that substrates may be added to or removed from the bundle so that the bundle will continue to operate as needed. The cylindrical nature of the substrates leaves gaps or channels between the substrates to which cooling fluid may be supplied for cooling the circuitry.

16 Claims, 4 Drawing Sheets

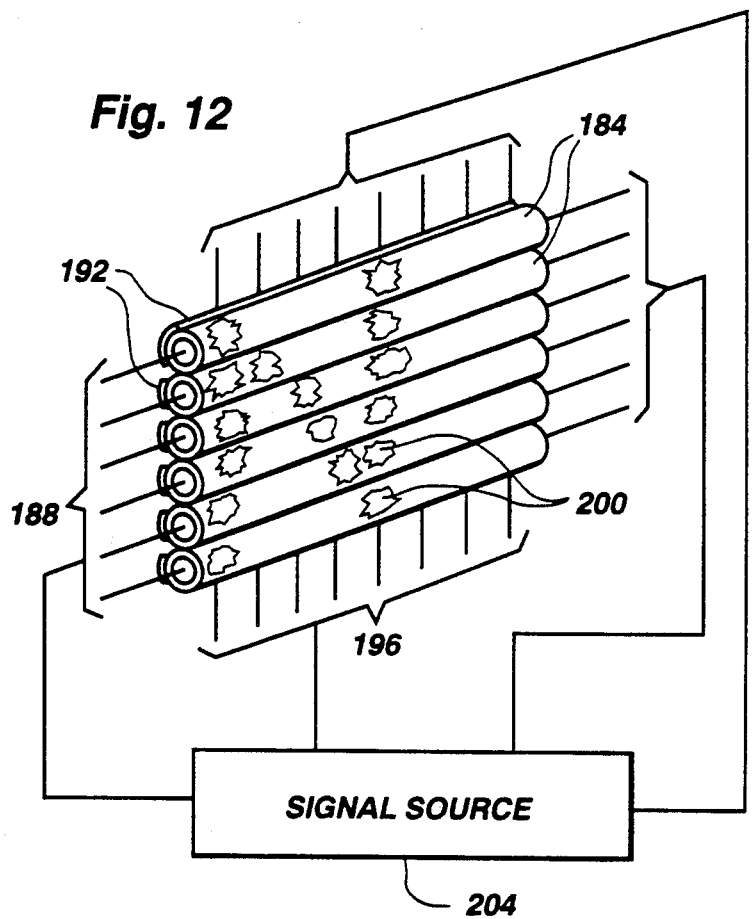

HIGH DENSITY, THREE-DIMENSIONAL, INTERCOUPLED CIRCUIT STRUCTURE

This is a continuation-in-part of application Ser. No. 816,628, filed Dec. 12, 1991 which is a continuation-in-part of application Ser. No. 07/647,659, filed Jan. 28, 1991 now U.S. Pat. No. 5,106,455.

BACKGROUND OF THE INVENTION

This invention relates to a system for constructing, integrated circuits on a plurality of three-dimensional objects and for arranging the objects so that the circuits may be selectively intercoupled, all in a high density configuration.

High density packing of circuit components on a planar circuit board or chip is commonplace today. Such circuit boards or chips may be formed in various ways including the use of lithographic techniques which allows for the precise manufacturing and formation of very small details on the circuit board or chip. However, such lithographic techniques have in the past generally been limited to the formation of the circuit structures on planar surfaces such as found on boards and chips.

With the above conventional approach to constructing circuits, in order to increase the circuit capacity in terms of quantity of components, it has been the typical practice to arrange circuit boards or chips in stacks, one above another, and then interconnect the circuits on different boards as well as circuits on the same board. See, for example, U.S. Pat. Nos. 4,771,366, 5,016,138, 5,006,925, and 4,884,167. As noted in at least some of these cited patents, as the number and density of components on a circuit board has increased and as the number of boards increases, it has become more difficult to make effective connections, especially between the boards. Also, with the increased density, heating becomes more of a problem and ways of cooling the circuits must be found to ensure accurate and reliable operation. As indicated in a number of the above-cited patents, there are various approaches to providing the required cooling of stacks of circuit boards but such approaches typically are cumbersome, require complicated structure, and have limited effectiveness.

A recent development in circuit construction allows for the fabrication of circuits on three-dimensional objects such as cylinders. See co-pending U.S. patent application, Ser. No. 816,628, filed Dec. 12, 1991. Now, instead of just the provision of circuits on generally flat circuit boards and chips which limits the density of electrical components which can be provided in a certain volume, as well as the interconnectability of components located on different boards or chips, circuit structures can be provided in which electrical components may be positioned about an entire three-dimensional substrate to both allow for increased density of components for a certain volume and allow for greater exposure of the components for purposes of connecting those components with components on other substrates.

SUMMARY OF THE INVENTION

It is an object of the invention to provide a three dimensional electrical circuit structure which allows for a high density packing of electrical components.

It is another object of the invention to provide such a structure utilizing constituent three-dimensional substrates for holding electrical components in which the components may be readily interconnected with one another, both on the same substrate and between substrates.

It is a further object of the invention to provide such a structure having a plurality of three-dimensional substrates in which the individual substrates may be readily removed and replaced with other substrates while maintaining the desired interconnection of electrical components between substrates.

It is an additional object of the invention to provide such a structure in which constituent substrates may be formed to nest or stack in close proximity to one another.

It is still another object of the invention to provide such a structure which lends itself to simple and efficient cooling of and heat dissipation from the electrical circuitry.

It is also an object of the invention to provide such a structure which may be configured to provide electronic systems such as display systems and the like.

The above and other objects of the invention are realized in a specific illustrative embodiment of a three-dimensional electrical circuit structure which includes a plurality of elongate body substrates, each of which includes one or more electrical components disposed on the surface thereof, and electrical conductors also disposed on the surface and coupled to one or more of the electrical components of that substrate.

In accordance with one aspect of the invention, the electrical conductors on the elongate body substrates are patterned so that when the substrates are placed in contact with one another, such as side-by-side and in parallel, electrical conductors on each substrate make electrical contact with electrical conductors of at least one other substrate to allow the transfer of electrical signals therebetween. Alternatively, the electrical conductors may be disposed at the ends of the substrates, and the substrates formed, so that the substrates may be placed end to end, with the electrical conductors on adjacent substrates making contact to allow exchange of electrical signals between substrates.

In accordance with another aspect of the invention, channels for carrying cooling fluid are formed in the elongate body substrates in parallel with the long axes thereof, or between the elongate body substrates when the substrates are positioned or bundled in a contacting, side-by-side, parallel configuration.

The elongate body substrates may have a variety of cross sections such as circular, oval, triangular, rectangular, hexagonal, etc. as may be desired to carry the circuitry and to allow for electrical conductors on one substrate to contact selected electrical conductors of other substrates when the substrates are bundled or positioned together.

With the configuration and structure described, a building block approach to constructing circuits may be taken in which substrates may be easily added to or taken from the composite whole, for example, to add or subtract memory, add or subtract computational power, etc. This could be done by adding additional substrates to a bundle, removing substrates and replacing them with other substrates, etc. where electrical interconnection to the added substrates is made by contact of surface location conductors. Also, selected interconnections between substrates may be had by proper positioning of the substrates in the bundle, relative to one another, such as by rotating a substrate and/or moving it longitudinally relative to the other substrates.

BRIEF DESCRIPTION OF THE DRAWINGS

The above and other objects, features and advantages of the invention will become apparent from a consideration of the following detailed description presented in connection with the accompanying drawings in which:

FIG. 12 is a perspective view of another embodiment of an array of substrates for producing an optical display in accordance with the present invention.

DETAILED DESCRIPTION

Figure 1:
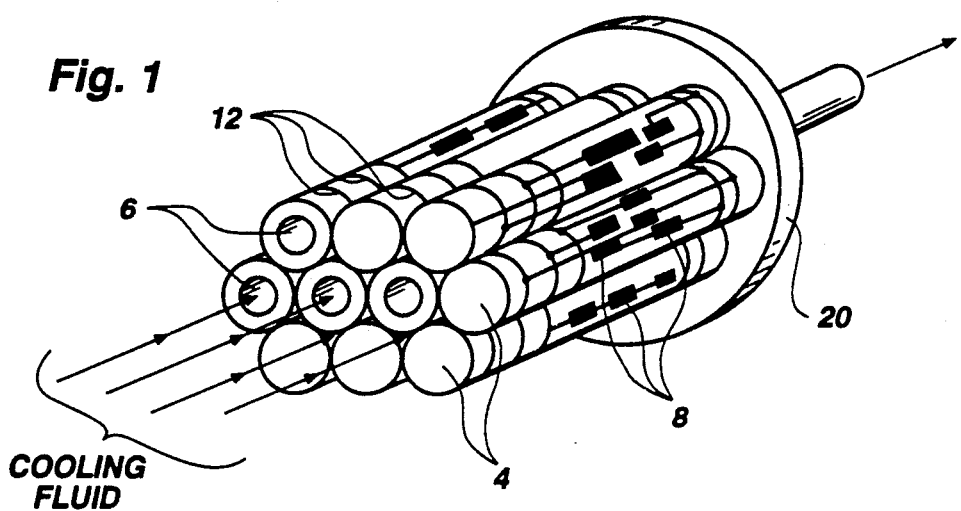
FIG. 1 is a perspective view of a high density, three-dimensional circuit structure, composed of a plurality of cylindrical substrates positioned together in contact with adjacent substrates, in accordance with the principles of the present invention.

Referring to FIG. 1, there is shown one illustrative embodiment of a three-dimensional, intercoupled circuit structure made in accordance with the present invention. This structure includes a plurality of cylinders 4 made, for example, of an insulator material such as quartz, silica, sapphire, etc., some of said cylinders including axially disposed bores or hollows 6. Formed on the cylinders 4 are various integrated circuit components 8 fabricated, for example, using non-planar, exposure beam lithography as described in the afore-cited co-pending patent application. Such lithography allows for the formation on the surface of three-dimensional objects and bodies of various integrated circuits which otherwise are conventionally formed on planar plates, chips or boards. The particular type of integrated circuit components is not a part of the present invention, and such components could be both active and passive electrical components such as, in the former case, transistors, diodes, semiconductors, etc. and, in the latter case, resistors, capacitors, inductors, etc. These components, in turn, could be fabricated into circuits such as amplifiers, power supplies, modulators and demodulators, etc.

The circuit components 8 are coupled to electrical conductors or leads 12 formed to extend both longitudinally on the surface of the cylinders and circumferentially thereabout, as shown. The conductors on each cylinder 4 are formed and positioned so as to selectively make electrical contact with conductors on adjacent cylinders with which said each cylinder is in contact. Thus, longitudinal conductors may be coupled to circuit components 8 to extend a distance longitudinally from the component so as to contact a ring or circumferential conductor on an adjacent cylinder when the two cylinders are placed together side-by-side. Alternatively, the longitudinal conductors may simply be positioned to connect with ring conductors which circumscribe the cylinder, which ring conductors, in turn, selectively contact ring conductors of adjacent cylinders. In this manner, electrical signals may be transferred not only between circuit components 8 on the same cylinder, but also between circuit components located on different cylinders. Further, the cylinders 4 and conductors 12 could be arranged to allow for transferring electrical signals from circuit components 8 on a certain cylinder, via conductors of an adjacent cylinder to circuit components located on a non-adjacent cylinder.

Because of the circuit component density achievable with the structure of FIG. 1, it may be necessary to provide for cooling the circuit components and this is achievable by either directing cooling fluid through the gaps formed between the cylinders when the cylinders are stacked together, or through the hollows 6 formed in the cylinders. Such cooling fluid would be applied to an end, intake manifold (not shown), through either the gaps or hollows 6 to an end, outlet manifold 20. The use of such cooling fluid would be to maintain an appropriate temperature for the circuit structure and package to ensure proper and reliable operation.

Figure 2A:
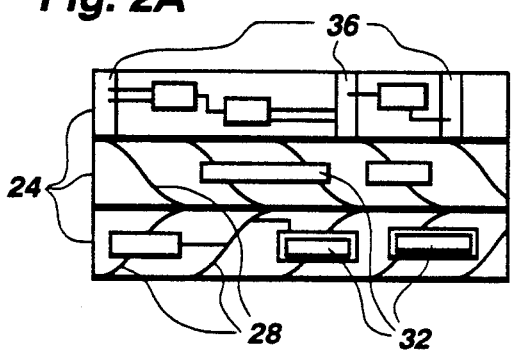
FIGS. 2A and 2B are a side, elevational view and an end view respectively of a circuit structure made in accordance with the present invention and composed of a plurality of cylindrical substrates.
Figure 2B:
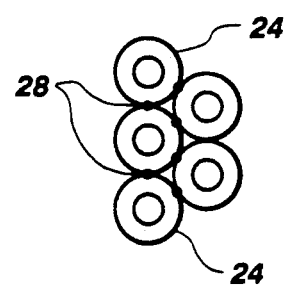

FIGS. 2A and 2B respectively show a side, elevational view and an end view of a plurality of cylindrical substrates 24 on two of which are formed helical conductors 28, some of which are connected to circuit components 32, and on one of which are formed ring or circumferential conductors 36. In the configuration shown in FIG. 2A, the helical conductors 28 on the two cylinders 24 are positioned so as to make contact between cylinders and allow for the transfer of electrical signals from components 32 of one cylinder to components 32 on the other cylinder. This is also illustrated in FIG. 2B, by the dots between the cylinders. Similarly, the ring conductors 36 are formed so as to make contact with at least some of the helical conductors 28 on the adjacent cylinder.

As can be visualized from FIG. 2A, rotating one or more of the cylinders 24 would result in the conductors 28 and 36 possibly moving out of contact with one another. Also, moving one or more of the cylinders 24 longitudinally would likewise possibly move the conductors 28 and 36 out of contact with one another. Of course, this simply illustrates that with proper rotation and/or longitudinal movement and positioning of the cylinders, appropriate connections between the cylinders can be effected.

It is also apparent from FIGS. 1, 2A and 2B that additional circuitry can be added to and built upon (or removed from) the existing bundle of cylinders and circuits by placing appropriate additional cylinders with circuitry into contact with the existing bundle. For example, if additional memory were to be added to a bundle of cylinders, then a cylinder with such additional memory would be placed into contact with the appropriate existing cylinders in the bundle.

The disposition of conductors on the cylindrical substrates in FIGS. 1, 2A and 2B is for illustrating that a variety of conductor formations could be provided to allow both for interconnecting circuit components on the same cylindrical substrate and circuit components on different cylindrical substrates.

FIGS. 3-6 show perspective views of elongate substrates having alternative cross-sections to allow for alternative ways for stacking of the substrates. No circuit components or conductors are shown on the elongate substrates of FIGS. 3-6 but they would be so formed in the same manner as is done for the cylindrical substrates of FIGS. 1 and 2, in accordance with the method of the afore-cited co-pending patent application.

Figure 3:
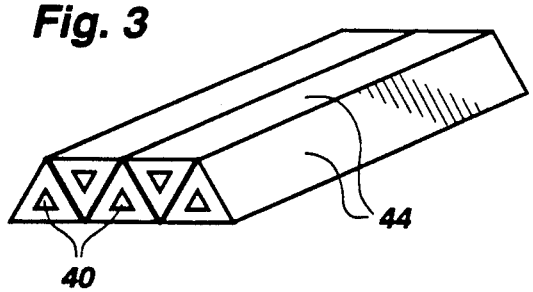
FIG. 3 is a perspective view of circuit structure of the present invention in which elongate substrates are formed with a triangular cross-sectional area to allow nesting or stacking together as shown.

FIG. 3 shows elongate substrates having triangular cross-sections and centrally disposed bores 40 extending the length of the substrates for carrying a cooling fluid. In this configuration, each of the substrates includes flats (side walls) 44 at least some of which on each substrate make contact with the flats of other substrates.

Figure 4:
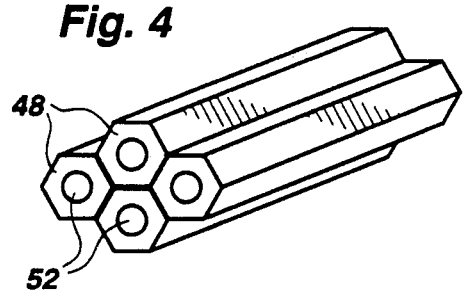
FIG. 4 is a perspective view of circuit structure of the present invention in which elongate substrates are formed with a hexagonal cross-sectional area to allow nesting or stacking together as shown.

FIG. 4 is a perspective view of four elongate substrates 48 having centrally disposed bores 52 extending the length thereof for carrying a cooling fluid. With the hexagonal cross-section configuration, the substrates 48 may stack or nest together with the flat side walls making intimate contact with the side walls of adjacent substrates.

Figure 5:
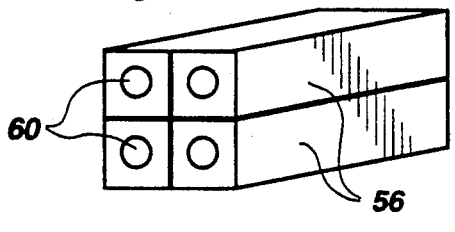
FIG. 5 is a perspective view of circuit structure of the present invention in which elongate substrates are formed with a rectangular cross-sectional area to allow nesting or stacking together as shown.

FIG. 5 shows elongate substrates 56 having rectangular (square) cross-sections, again with centrally disposed bores or hollows 60 extending the lengths thereof.

Figure 6:
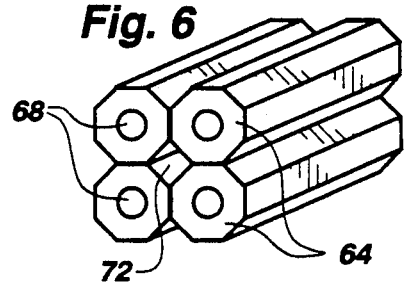
FIG. 6 is a perspective view of circuit structure of the present invention in which elongate substrates are formed with a octagonal cross-sectional area to allow nesting or stacking together as shown.

Finally, FIG. 6 shows elongate substrate 64 having octagonal cross-sections, also with centrally disposed bores 68 and further with a gap or opening located centrally of the four substrates 64, which could also be utilized for carrying a cooling fluid. Of course, other substrate shapes could be provided so as to allow stacking together of the substrates for the high density packing of circuit components with the capability of electrical signal interchange between substrates.

Figure 7A:
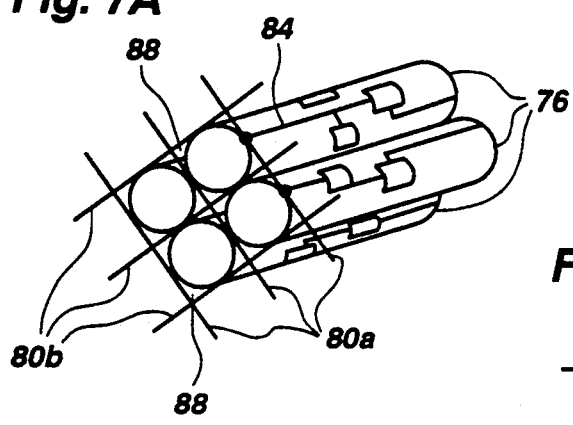
FIGS. 7A and 7B are respectively a perspective view of a circuit structure made in accordance with the present invention showing cylindrical substrates held in place by interconnect and support elements, and an end view of another embodiment of interconnect and support elements.

FIG. 7A is a perspective view showing four cylindrical substrates 76 held together in a nested relationship by a lattice of rods 80. The rods 80 advantageously are made of an electrically conductive material to also serve to make contact with conductors 84 on the cylinders 76 to carry electrical signals and provide connections between the cylinders. The rods are formed of one set 80a of spaced-apart, generally parallel rods disposed in a plane, and another set 80b of spaced-apart, generally parallel rods disposed in a plane adjacent to and substantially parallel with the first plane so that the one set 80a intersects the other 80b at an acute or right angle to define quadrangular openings 88 in the lattice, each for receiving and holding a different one of the cylinders 76. The rods 80 are laterally resilient so as to flex to accommodate receiving and holding of the cylinders and accommodate electrical contact with conductors 84 on the cylinders. Of course, more than one lattice could be utilized to better hold and support the cylinders; for example, such a lattice could be provided at the end of the cylinders 76 opposite that at which the lattice rods 80 are located.

Figure 7B:
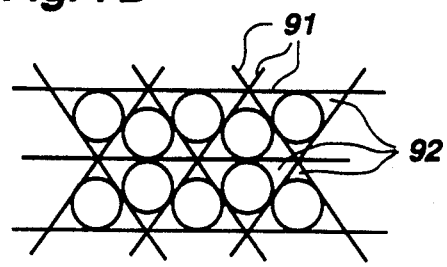

FIG. 7B shows an end view of an alternative arrangement for holding cylinder substrates with a lattice. In this arrangement, three parallel sets of rods 91 are utilized to form triangular openings 92 to hold the cylinders. The lattice rods 91, as with the FIG. 7A arrangement, would provide both support and electrical interconnection between the cylinders 92.

Figure 8:
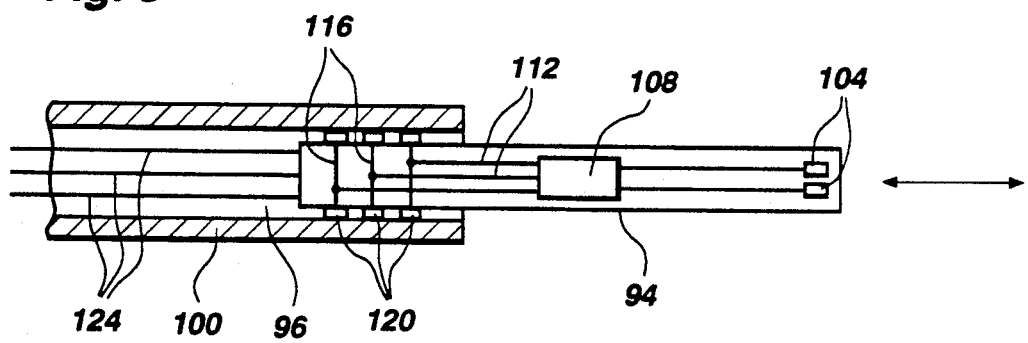
FIG. 8 is a side, partially cross-sectional view of circuit structure made in accordance with the present invention in which one element plugs into another element.

FIG. 8 shows a side, partially cross-sectional view of a generally cylindrical substrate 94 removably disposed in a hollow 96 of a cylindrical substrate 100. Circuit components are disposed on the substrate 94, on the exterior thereof to include a pair of sensors 104 suitable, for example, for sensing chemical species (in a chemical composition to which the sensors are exposed), heat, light, electrical fields, etc. The specific construction of such sensors 104 is not the subject of the present invention but rather, the manner of positioning of sensors on an elongate substrate which may be removably inserted into the hollow of a second substrate to allow for the exchange of electrical signals therebetween. The sensors 104 are coupled to a processing circuit 108 which, for example, could process signals received from the sensors 104 to amplify them, reshape them, etc. for transfer onto conductors 112, also formed on the substrate 92. The conductors 112, in turn, are coupled to ring conductors 116 which circumscribe the end of the substrate 94 opposite the end at which the sensors 104 are located. When the substrate 94 is inserted into the substrate 100, the ring conductors 116 make contact with a second set of ring conductors 120 which are formed on the inside wall of the hollow 96 to circumscribe the hollow. These ring conductors 120 in turn, are coupled to conductors 124 which extend through the hollow to a utilization circuit (not shown) such as, for example, a display means for displaying a value representing the parameter sensed by the sensors 104.

With the configuration of FIG. 8, various sensor substrates could be provided so that if a particular physical parameter were to be sensed, an appropriate sensor substrate could be plugged into the end of substrate 100 so that ring conductors 116 made contact with ring conductors 120, and the sensing operation could then proceed. When it were desired to sense or detect a different physical parameter, then the appropriate sensing substrate 92 for that physical parameter could be selected and plugged into the substrate 100 as earlier described. Although the substrates 94 and 100 are shown to be fairly large in FIG. 8, with the use of the non-planar lithography described in the previously cited co-pending patent application, very small fine-detailed circuit components could be formed on very small substrates of, for example, down to one hundred microns in diameter.

Figure 9:
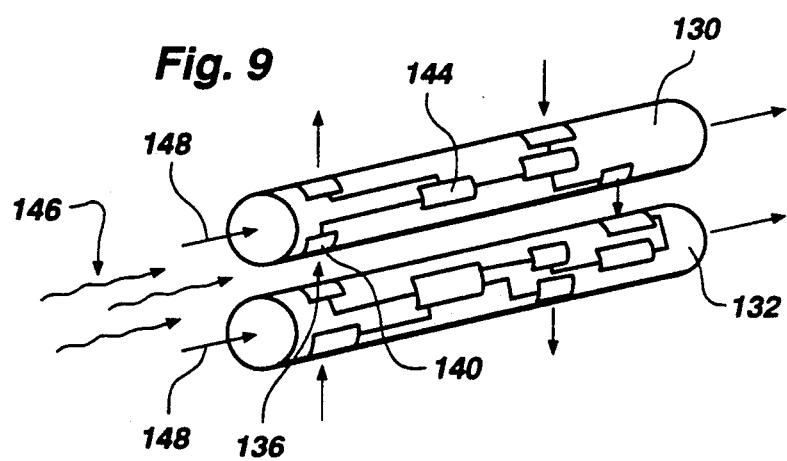
FIG. 9 is a perspective view of a circuit structure made in accordance with the present invention and showing circuitry on two cylindrical substrates being coupled for transmitting signals therebetween by either light, electric field, or radio signals.

FIG. 9 shows a pair of cylindrical substrates 130 and 132 spaced apart but positioned generally parallel with one another. Again, electrical circuitry is formed on the exterior surface of each of the substrates to include in this instance elements for allowing signalling between the substrates via light, capacitive coupling, or radio frequency signals. In the case of light coupling, element 136 on substrate 132 would illustratively be a light emitter such as a photodiode and element 140 on substrate 130 would be a light receiver such as a photocell. Then, if signals were to be passed from substrate 132 to substrate 130, the light emitting element 136 would energized to produce a light signal which would be received by light receiving element 140 which would produce a signal representing the light signal received, for transfer to a circuit component 144, for example.

In the case of capacitive electrical field coupling, the element 136 on the substrate 132 could simply be a capacitor plate, as would element 140 on substrate 130. Then, when electrical charges were supplied to the element 136, to produce an electrical field directed to element 140, element 140 would produce corresponding charges and thus signals representing the intensity of the electrical field. This information, again, would be passed to circuit component 144 for further processing, for example. Alternatively to varying the electrical field developed between capacitor plates 136 and 140, a dielectric medium, represented by arrows 146, could be provided between the plates 136 and 140 and then the dielectric constant varied so as to vary the strength of the electric field detected by plate 140. Varying the dielectric constant could be carried out by simply changing the composition of the dielectric medium as it was passed between the plates 136 and 140.

For radio frequency signalling between the substrates 130 and 132, element 136 would be formed to be a transmitting antenna and element 140 would be formed to be a receiving antenna, and then the circuitry on substrate 132 would be formed to include radio frequency signal transmitting circuitry, and the circuitry on substrate 130 would be formed to include radio frequency signal receiving circuitry.

Of course, additional substrates formed in an array with the two substrates 130 and 132 could also be provided to allow for communicating among a large number of substrates.

The cylinder substrates 130 and 132 of FIG. 9 could be formed of fiber optic strands made, for example, of quartz, silica, sapphire, etc. Light, represented by arrows 148, could be supplied to and transmitted along the fiber optic strands 130 and 132, and the strands could have formed thereon light detecting elements, such as photocells, for picking up or detecting the intensity of light being transmitted along the strand. Signals representing this detected intensity could be provided to other circuitry formed on the strands, and processed as desired.

From the above description of FIG. 9 it can be seen that signalling between the substrates can be effected in a variety of ways even without the substrates being in contact with one another, and also that signals can be transmitted along, i.e., inside of, the substrates via the use of light.

Figure 10:
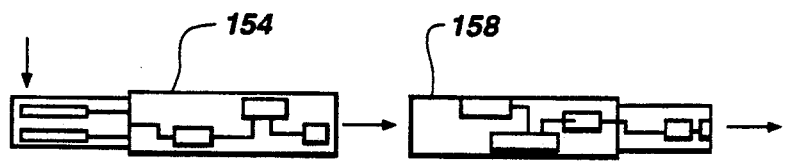
FIG. 10 is a side, elevational view of a pair of cylindrical substrates made in accordance with the present invention and containing, on one substrate, sensing circuitry and, on the other substrate, emitter circuitry.

FIG. 10 is a side, elevational view of a pair of cylindrical substrates 154 and 158, one of which (substrate 154) is adapted for sensing a physical parameter, and the other of which (substrate 158) is adapted for emitting a signal identifying the value of the parameter sensed by the first substrate. Circuitry is formed on both substrates in a manner already described for carrying out the respective functions of the substrates. Communication between substrate 154 and substrate 158 may be had by an electromagnetic signal transmission such as light or a radio frequency signal.

The sensor circuitry on substrate 154, at the left end thereof in FIG. 10, might illustratively include circuitry for sensing various chemical species such as described in U.S. Pat. No. 4,020,830, circuitry for sensing the intensity of light such as by a photocell, circuitry for sensing the temperature of a fluid to which the substrate 154 is exposed, etc. Signals produced by the sensing circuitry representing the value of the physical parameter sensed would be processed by other circuitry on the substrate 154 and then signals, again representing the value of the physical parameter sensed, transmitted by the substrate 154 to the substrate 158 as previously mentioned. Circuitry on substrate 158 would receive these transmitted signals, and, in turn, produce or cause production of signals for emission outwardly of the substrate, such as light signals or radio frequency signals, indicating the value of the physical parameter sensed.

The FIG. 10 embodiment of the present invention simply shows how a transducer might be constructed for detecting or sensing physical parameters and then emitting a signal representing the value of the sensed parameter. Of course, communication between the substrate 154 and 158 could be had simply by coupling the two substrates together by an electrical conductor, in lieu of the non-contact communication earlier described.

Figure 11:
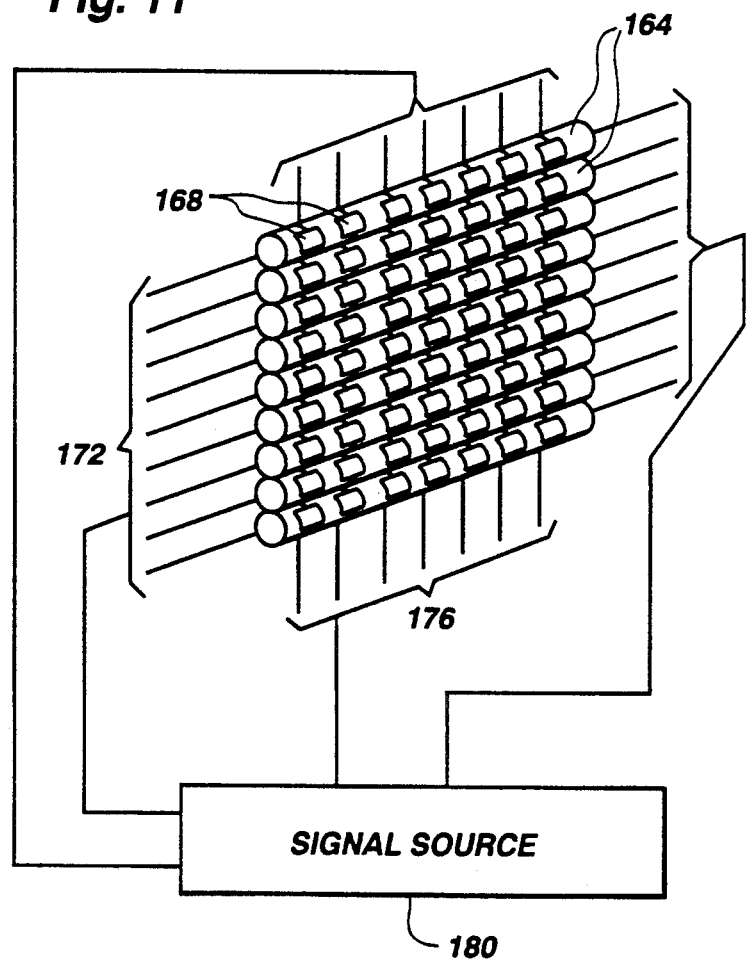
FIG. 11 is a perspective view of an array of substrates made in accordance with the present invention suitable for either producing an optical display or for detecting optical images.

FIGS. 11 and 12 are perspective views of arrays of substrates suitable for producing optical displays. FIG. 11 shows a plurality of cylindrical substrates 164 arranged in parallel in a stack to present a generally planar front surface. Formed on the front surfaces of the substrates 164 are light emitting elements 168, such as light-emitting diodes or the like. Disposed on the back side of the substrates 164 (not seen in FIG. 11) are a plurality of element driving circuits, each coupled to a respective one of the elements 168 and to one horizontal conductor of the conductors 172 and one vertical conductor of the conductors 176. Thus, there are a total of seven (columns) x nine (row) light emitting elements, and the same number of driving circuits coupled to respective light emitting elements.

Optical displays are produced by supplying electrical signals (from a signal source 180) to selected ones of the horizontal conductors 172 and vertical conductors 176 such that each circuit on the back of the substrates 164 which is connected to a horizontal conductor and vertical conductor which both receive an electrical signal will energize a respective light emitting element 168. The circuits on the back of the substrate could utilize simple AND gate logic to determine when both horizontal and vertical conductors to which they were connected receive electrical signals. In this fashion, various optical patterns can be produced on the optical display structure of FIG. 11.

The FIG. 11 structure could also be adapted to allow for optical detection of light patterns by providing light detecting elements, such as photocells, in place of the light emitting elements 168. Then, when the front surface of the stack of substrates 164 were exposed to a particular light pattern, certain ones of the photocells on the front surfaces of the substrates would detect light, or at least certain levels of light, while others would not and the circuitry on the back of the substrates 164 would produce signals on both the horizontal conductor and vertical conductor to which they are connected. These signals would be supplied to a utilization circuit (in place of signal source 180) connected to both the horizontal conductors 172 and vertical conductors 176 which would determine which photocells detected light and thus determine the light pattern to which the substrate stack was exposed. The utilization device 180 for processing the signals on the horizontal conductors 172 and vertical conductors 176 for thus determining the detected light pattern, could simply be a microprocessor or other data processing system.

FIG. 12 is a perspective view of another embodiment of an array of substrates for producing an optical display including a plurality of transparent tubes, made of glass or clear plastic, positioned generally side-by-side and in parallel as shown. Each tube 184 is filled with an excitable inert gas such as neon (the tubes 184 would be closed on the ends to prevent the escape of the inert gas, although they are shown as being open in FIG. 12, for illustrative purposes only. Threaded through each of the tubes 184 is a different one of a plurality of horizontal electrical conductors 188. Disposed on a back side of each of the tubes 184 are elongate conductor strips 192. Extending vertically in parallel with one another to contact each of the conductive strips 192 at different spaced-apart locations along the strips, are a plurality of vertical electrical conductors 196.

Again, by supplying electrical signals (from a signal source 204) to selected ones of the horizontal conductors 188 and vertical conductors 196, the inert gas located in the general area of the intersection of a horizontal conductor and vertical conductor to which electrical signals are applied will be excited to emit light. Excited areas of gas in the tubes 184 are illustrated by the patches 200 in FIG. 12. The electrical signals supplied to only one conductor is insufficient to excite the gas but the electrical signals supplied to two intersecting conductors is sufficient. The gas is excited by the electric fields produced by the flow of current through the conductors, which fields, when they exceed a certain level, excite or energize the inert gas in close proximity to such fields.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. For example, although the substrates of the embodiments were generally shown and described as being positioned/stacked in parallel, other positioning/stacking arrangements could also be provided such as cross-wise, non-parallel stacking, a combination of cross-wise and parallel stacking, etc.

What is claimed is:

1. Three-dimensional electrical circuit structure comprising at least two elongate body substrates, each including
   one or more electrical components disposed on said each substrate's surface, and
   one or more electrical conductors disposed on said each substrate's surface and coupled to at least one of the electrical components on said each body substrate to carry electrical signals thereto and/or therefrom,
   said body substrates being positionable so that at least one electrical conductor on one of the body substrates surfaces directly contacts at least one electrical conductor on another body substrate surface to allow for the transfer of electrical signals between electrical components on different body substrates.

2. A circuit structure as in claim 1 wherein the body substrates include generally axially disposed hollows for allowing the flow therethrough of cooling fluid.

3. A circuit structure as in claim 1 wherein the body substrates include generally axially disposed hollows, said structure further including one or more electrical conductors disposed to extend through the hollows of one or more body substrates for carrying electrical signals from one body substrate to another.

4. A circuit structure as in claim 1 further including a plurality of conductors disposed in contact with electrical components on different ones of the body substrates to extend between the substrates and carry electrical signals therebetween.

5. A circuit structure as in claim 1 wherein the body substrates have generally cylindrical cross-sections.

6. A circuit structure as in claim 5 wherein the cylindrical cross-sections of the body substrates are substantially the same size.

7. A circuit structure as in claim 5 wherein the electrical conductors are disposed in a generally helical fashion about respective body substrates so that at least one conductor on one body substrate contacts at least one conductor on another body substrate when said one and said another body substrates are positioned side-by-side.

8. A circuit structure as in claim 5 wherein the electrical conductors are each disposed to include a generally circumferential section and linear section on respective body substrates so that at least one conductor on one body substrate contacts at least one conductor on another body substrate when said one and said another body substrates are positioned side-by-side.

9. A circuit structure as in claim 5 wherein at least one body substrate includes a receptacle at least at one end thereof, said receptacle having side walls, said circuit structure further including electrical conductors disposed on the side walls of the receptacle and coupled to a utilization device, wherein at least one electrical conductor disposed on another body substrate is positioned at one end thereof, and wherein said one end of said another body substrate is dimensioned for insertion into the receptacle of said one body substrate so that the conductor positioned at said one end contacts the conductor disposed on the side walls of the receptacle to allow for the transfer of electrical signals therebetween.

10. A circuit structure as in claim 9 further including means disposed on the other end of said another body substrate for sensing a physical property of the environment to which the sensing means is exposed and for producing an electrical signal representing the physical property, and conductor means coupling the sensing means to the conductor positioned at said one end of said another body substrate.

11. A circuit structure as in claim 3 further including a first set of spaced-apart, generally parallel electrically conductive rods disposed in a first plane, and a second set of spaced-apart, generally parallel electrically conductive rods disposed in a second plane adjacent to and parallel with the first plane to form a lattice in which the rods in the first set form an acute or right angle with the rods in the second set to define a plurality of nested quadragonal openings in the lattice, each for receiving a different one of the body substrates whose long axes are generally normal to the planes, said sets of rods thereby providing support for the body substrates, and electrical coupling between components on different body substrates.

12. A circuit structure as in claim 11 wherein the rods are laterally resilient.

13. A circuit structure as in claim 1 wherein the body substrates have generally triangular cross-sections with three side wall flats, and centrally positioned bores extending through the body substrates, from one end to the other, for carrying cooling fluid, and wherein the body substrates are nested together side-by-side with at least one side wall flat of one body substrate being in contact with a side wall flat of another body substrate.

14. A circuit structure as in claim 1 wherein the body substrates have generally rectangular cross-sections with four side wall flats, and centrally positioned bores extending through the body substrates, from one end to the other, for carrying cooling fluid, and wherein the body substrates are nested together side-by-side with at least one side wall flat of one body substrate being in contact with a side wall flat of another body substrate.

15. A circuit substrate as in claim 1 wherein the body substrates have generally hexagonal cross-sections with six side wall flats, and centrally positioned bores extending through the body substrates, from one end to the other, for carrying cooling fluid, and wherein the body substrates are nested together side-by-side with at least one side wall flat of one body substrate being in contact with a side wall flat of another body substrate.

16. A circuit substrate as in claim 1 wherein the body substrates have generally octagonal cross-sections with eight side wall flats, and wherein the body substrates are nested together side-by-side with at least one side wall flat of one body substrate being in contact with a side wall flat of another body substrate to define bores between the body substrates, extending from one end to the other, for carrying cooling fluid.

* * * * *